(12) United States Patent
Kamijo et al.

(10) Patent No.: US 11,887,845 B2
(45) Date of Patent: Jan. 30, 2024

(54) METHOD FOR PRODUCING THREE-DIMENSIONAL STRUCTURE, METHOD FOR PRODUCING VERTICAL TRANSISTOR, VERTICAL TRANSISTOR WAFER, AND VERTICAL TRANSISTOR SUBSTRATE

(71) Applicants: GLOBALWAFERS JAPAN CO., LTD., Niigata (JP); TOHOKU UNIVERSITY, Sendai (JP)

(72) Inventors: Kazutaka Kamijo, Kitakanbara-gun (JP); Etsuo Fukuda, Kitakanbara-gun (JP); Takashi Ishikawa, Kitakanbara-gun (JP); Koji Izunome, Kitakanbara-gun (JP); Moriya Miyashita, Kitakanbara-gun (JP); Takao Sakamoto, Kitakanbara-gun (JP); Tetsuo Endoh, Sendai (JP)

(73) Assignees: GLOBALWAFERS JAPAN CO., LTD., Niigata (JP); TOHOKU UNIVERSITY, Sendai (JP)

( * ) Notice: Subject to any disclaimer, the term of this patent is extended or adjusted under 35 U.S.C. 154(b) by 0 days.

(21) Appl. No.: 17/488,883

(22) Filed: Sep. 29, 2021

(65) Prior Publication Data
US 2022/0093396 A1 Mar. 24, 2022

Related U.S. Application Data

(62) Division of application No. 16/632,607, filed as application No. PCT/JP2018/026702 on Jul. 17, 2018.

(30) Foreign Application Priority Data

Jul. 19, 2017 (JP) .................................. 2017-140079

(51) Int. Cl.
*H01L 21/02* (2006.01)
*H01L 29/66* (2006.01)

(52) U.S. Cl.
CPC .. *H01L 21/02255* (2013.01); *H01L 21/02238* (2013.01); *H01L 29/66666* (2013.01)

(58) Field of Classification Search
CPC ......... H01L 21/02255; H01L 21/02238; H01L 29/66666; H01L 21/02164; H01L 21/316;
(Continued)

(56) References Cited

U.S. PATENT DOCUMENTS 9,837,405 B1  12/2017  Cheng et al.
2010/0184267 A1  7/2010  Kabe et al.
(Continued)

FOREIGN PATENT DOCUMENTS

JP   H03-133121 A   6/1991
JP   H04-264776 A   9/1992
(Continued)

OTHER PUBLICATIONS

Sep. 29, 2022 Office Action Issued in U.S. Appl. No. 16/632,607.
(Continued)

*Primary Examiner* — Julia Slutsker
(74) *Attorney, Agent, or Firm* — Oliff PLC (57) ABSTRACT

A method for producing a three-dimensional structure, a method for producing a vertical transistor, a vertical transistor wafer, and a vertical transistor substrate, capable of suppressing the emission of Si due to a heat treatment and making an interface between an oxide film and a core mainly consisting of Si relatively smooth include: forming a three-dimensional shape by processing (for example, by etching) a surface layer of a monocrystalline silicon substrate, the surface layer having an oxygen concentration of $1 \times 10^{17}$ atoms/cm$^3$ or more; and then forming an oxide film on the
(Continued)

surface of the three-dimensional shape by performing a heat treatment. The three-dimensional structure has a shape having projections and recesses in a thickness direction of the silicon substrate, and a height in the thickness direction of the silicon substrate is between 1 nm and 1000 nm, and preferably between 1 nm and 100 nm.

5 Claims, 4 Drawing Sheets

(58) Field of Classification Search
CPC ......... H01L 21/28211; H01L 21/30604; H01L 29/78; H01L 29/0676
See application file for complete search history.

(56) References Cited

U.S. PATENT DOCUMENTS

| | | | |
|---|---|---|---|
| 2010/0210096 | A1 | 8/2010 | Masuoka et al. |
| 2016/0225851 | A1* | 8/2016 | Li .................. H01L 29/0673 |
| 2017/0213743 | A1 | 7/2017 | Pan et al. |
| 2017/0288040 | A1 | 10/2017 | Augendre et al. |

FOREIGN PATENT DOCUMENTS

| | | | |
|---|---|---|---|
| JP | H08-335668 | A | 12/1996 |
| JP | 2001-15504 | A | 1/2001 |
| JP | 2001-210869 | A | 8/2001 |
| JP | 2004-356314 | A | 12/2004 |
| JP | 2007-529115 | A | 10/2007 |
| JP | 2008-153530 | A | 7/2008 |
| JP | 2009-105227 | A | 5/2009 |
| JP | 2010-135592 | A | 6/2010 |
| JP | 2010-287739 | A | 12/2010 |
| JP | 2011-138955 | A | 7/2011 |
| JP | 5176180 | B2 | 4/2013 |
| WO | 2005/065385 | A2 | 7/2005 |
| WO | 2006/028777 | A1 | 3/2006 |
| WO | 2009/096002 | A1 | 8/2009 |

OTHER PUBLICATIONS

Carim et al., "Evolution of Si/SiO2 Interface Roughness," Journal of The Electrochemical Society, 134, pp. 741-746, 1987 (Year : 1987).
Apr. 13, 2022 Office Action issued in U.S. Appl. No. 16/632,607.
Oct. 16, 2018 Search Report issued in International Patent Application No. PCT/JP2018/026702.
Jan. 21, 2020 International Preliminary Report on Patentability issued in International Patent Application No. PCT/JP2018/026702.
Oct. 4, 2021 Office Action issued in U.S. Appl. No. 16/632,607.
Feb. 28, 2023 Office Action issued in U.S. Appl. No. 16/632,607.
Tang et al., "A Simple Method for Measuring Si-Fin Sidewall Roughness by AFM," IEEE Transactions on Nanotechnology; vol. 8; No. 5; Sep. 2009 (Year: 2009).
Jul. 20, 2023 Office Action issued in U.S. Appl. No. 16/632,607.
Kalem et al., "Controlled thinning and surface smoothening of silicon nanopillars"; 2009 Nanotechnology 20 445303 (Oct. 2009).

* cited by examiner

METHOD FOR PRODUCING THREE-DIMENSIONAL STRUCTURE, METHOD FOR PRODUCING VERTICAL TRANSISTOR, VERTICAL TRANSISTOR WAFER, AND VERTICAL TRANSISTOR SUBSTRATE

This is a Division of application Ser. No. 16/632,607 filed Jan. 21, 2020, which in turn is a National Phase of International Patent Application No. PCT/JP2018/026702 filed Jul. 17, 2018, which claims the benefit of Japanese Patent Application no. 2017-140079 filed Jul. 19, 2017. The disclosure of the prior applications is hereby incorporated by reference herein in its entirety.

FIELD OF THE INVENTION

The present invention relates to a method for producing a three-dimensional structure, a method for producing a vertical transistor, a vertical transistor wafer, and a vertical transistor substrate.

DESCRIPTION OF RELATED ART

Conventionally, in order to form a gate region or the like when a vertical transistor having a three-dimensional structure is produced using a silicon substrate, the three-dimensional structure of which an inner part is formed of a core mainly consisting of Si and of which the surface is covered by an oxide film of a silicon dioxide is formed by etching a surface of the silicon substrate to form a three-dimensional shape made up of pillars and trenches and then oxidating the surface by a heat treatment or the like (for example, see Patent Literature 1 or 2).

CITATION LIST

Patent Literature 1: JP-B-5176180
Patent Literature 2: JP-A-2007-529115

SUMMARY OF THE INVENTION

However, in the methods disclosed in Patent Literatures 1 and 2, since a silicon substrate in which an oxygen concentration of the surface layer that forms the three-dimensional shape is approximately $1\times10^{16}$ atoms/cm$^3$ or more, and when a heat treatment is performed, Si is emitted from the three-dimensional shape, there is a problem that the core mainly consisting of Si becomes narrow. Moreover, since projections and recesses are formed on an interface between the oxide film and the core of the three-dimensional structure, there is a problem that an electrical resistance increases and electrical characteristics deteriorate.

The present invention has been made in view of such problems, and an object thereof is capable of suppressing the emission of Si by a heat treatment in production, it is an relatively smooth interface between an oxide film and a core mainly consisting of Si, and it is provide a method for producing a three-dimensional structure, a method for producing a vertical transistor, a vertical transistor wafer, and a vertical transistor substrate.

In order to attain the object, a method for producing a three-dimensional structure according to the present invention includes: processing a surface layer of a silicon substrate to form a three-dimensional shape, the surface layer having an oxygen concentration of $1\times10^{17}$ atoms/cm$^3$ or more; and performing a heat treatment to form an oxide film on a surface of the three-dimensional shape to produce the three-dimensional structure.

According to the method for producing the three-dimensional structure according to the present invention, it is possible to produce a three-dimensional structure having a core portion mainly consisting of Si and an oxide film formed on the surface thereof. In the method for producing the three-dimensional structure according to the present invention, since the silicon substrate having the surface layer having an oxygen concentration of $1\times10^{17}$ atoms/cm$^3$ or more is used, when a heat treatment is performed, oxygen of a surface layer diffuses outward, and oxygen atms necessary for forming the oxide film can be supplied from the silicon substrate as well as the heat treatment atmosphere simultaneously. In this way, it is possible to realize uniform oxide film growth. Moreover, since the oxygen is supplied from the silicon substrate, the oxygen is directly combined with Si emitted from the surface of the three-dimensional shape to form an Si—O bond. In this manner, it is possible to allow Si to contribute to forming the oxide film without being sublimated from the oxide film and to suppress the emission of Si due to the heat treatment. Moreover, in this way, it is possible to prevent the core portion mainly consisting of Si from becoming narrow.

In the method for producing the three-dimensional structure according to the present invention, since a uniform oxide film is formed by the heat treatment, it is possible to make an interface between the oxide film and the core portion smooth as compared to when a silicon substrate having a low oxygen concentration is used. In this way, since movement of electrons in the core becomes smooth, an electrical resistance decreases, power consumption can be suppressed, and excellent electrical characteristics can be obtained. Moreover, since introduction sources of crystalline defects such as dislocation and stacking defects decrease, it is possible to contribute to suppressing structural defects such as deformation and rupture.

In the method for producing the three-dimensional structure according to the present invention, since it is thought that the effect of suppressing the emission of Si due to the heat treatment and the smoothness of the interface between the oxide film and the core are improved as the oxygen concentration increases, the oxygen concentration of the surface layer is particularly preferably $1\times10^{18}$ atoms/cm$^3$ or more.

In the method for producing the three-dimensional structure according to the present invention, the three-dimensional structure has a shape having projections and recesses in a thickness direction of the silicon substrate, and a height in a thickness direction of the silicon substrate is preferably between 1 nm and 1000 nm, particularly preferably 5 nm or more, and particularly preferably 100 nm or less. Moreover, in the three-dimensional structure, a length in a direction vertical to a thickness direction (height) of the silicon substrate is preferably between 1 nm and 10000 nm, and a width in a direction vertical to the thickness direction (height) of the silicon substrate is between 1 nm and 100 nm. In these cases, for example, as the three-dimensional structure, a pillar structure, a fin structure, a wire structure, a dot structure, a ribbon structure, and a structure having a trench, and the like can be formed.

In the method for producing the three-dimensional structure according to the present invention, the three-dimensional shape may be formed by processing the surface layer according to an arbitrary method, and for example, the surface layer can be processed by etching. Moreover, in the method for producing the three-dimensional structure according to the present invention, the silicon substrate is preferably a monocrystalline silicon substrate.

A method for producing a vertical transistor according to the present invention produces transistors using a three-dimensional structure having the oxide film produced according to the method for producing the three-dimensional structure according to the present invention.

Since the method for producing the vertical transistor according to the present invention uses the three-dimensional structure produced according to the method for producing the three-dimensional structure according to the present invention, it is possible to produce vertical transistors having excellent electrical characteristics. The method for producing the vertical transistor using the three-dimensional structure may be an arbitrary method. Here, the vertical transistor is a transistor having a three-dimensional structure.

A vertical transistor wafer according to the present invention includes a silicon substrate having a surface layer having an oxygen concentration of $1 \times 10^{17}$ atoms/cm$^3$ or more. The surface preferably has the oxygen concentration of $1 \times 10^{18}$ atoms/cm$^3$ or more.

In the vertical transistor wafer according to the present invention, since the surface layer of the silicon substrate has an oxygen concentration of $1 \times 10^{17}$ or $1 \times 10^{18}$ atoms/cm$^3$ or more, the vertical transistor wafer can be ideally used in the method for producing the three-dimensional structure and the method for producing the vertical transistor according to the present invention. When the vertical transistor wafer according to the present invention is used in the method for producing the three-dimensional structure and the method for producing the vertical transistor according to the present invention, it is possible to suppress the emission of Si due to a heat treatment and make the interface between the oxide film and the core smooth. In this way, it is possible to produce vertical transistors having excellent electrical characteristics.

A vertical transistor substrate according to the present invention includes: a silicon substrate; and a three-dimensional structure provided on a surface layer of the silicon substrate, wherein the three-dimensional structure has a core mainly consisting of Si and being continuous from the silicon substrate and a film formed from SiO$_2$ and covering a surface of the core, and a height difference of projections and recesses having a period of 10 nm or smaller on an interface between the film and the core is 1.5 nm or smaller.

The vertical transistor substrate according to the present invention can be ideally produced according to the method for producing the three-dimensional structure and the method for producing the vertical transistor according to the present invention using the vertical transistor wafer according to the present invention. In the vertical transistor substrate according to the present invention, the projections and recesses having a period of 10 nm or smaller on the interface between the film formed from SiO$_2$ and the core of the three-dimensional structure has a height difference of 1.5 nm or smaller and has a relatively smooth shape, movement of electrons in the core is smooth, an electrical resistance decreases, power consumption is suppressed, and excellent electrical characteristics are obtained. In this way, it is possible to produce vertical transistors having excellent electrical characteristics. The vertical transistor substrate according to the present invention may be formed from a silicon substrate having a three-dimensional shape on the surface thereof as a preliminary step for forming a three-dimensional structure, and the oxygen concentration of the surface having the three-dimensional shape of the silicon substrate may be $1 \times 10^{17}$ atoms/cm$^3$ or more and preferably $1 \times 10^{18}$ atoms/cm$^3$ or more.

A three-dimensional structure transistor according to the present invention includes a three-dimensional structure of which the diameter or the shortest side is 1 μm or smaller, wherein the transistor is fabricated using a three-dimensional structure obtained by processing an Si substrate in which at least an oxygen concentration in a region up to a depth in a height direction of the three-dimensional structure is $1 \times 10^{18}$ atoms/cm$^3$ or more. The three-dimensional structure transistor according to the present invention can be ideally produced according to the method for producing the three-dimensional structure and the method for producing the vertical transistor according to the present invention and can suppress the emission of Si due to the heat treatment during production. Moreover, the interface between the oxide film and the core mainly consisting of Si is relatively smooth, and excellent electrical characteristics are obtained.

According to the present invention, it is capable of suppressing the emission of Si by a heat treatment in production and making an interface between an oxide film and a core mainly consisting of Si relatively smooth. And, it of above is possible to provide a method for producing three-dimensional structures, a method for producing vertical transistors, a wafer for vertical transistors, and a substrate for vertical transistors.

BRIEF DESCRIPTION OF THE DRAWINGS

FIGS. 1 (a) to 1(c) relate to a method for producing a three-dimensional structure according to an embodiment of the present invention and are graphs illustrating oxygen concentrations before a heat treatment (As-Product) and after the heat treatment (900° C.-4 h), of silicon substrates in which oxygen concentrations of a surface layer are approximately $1 \times 10^{18}$ atoms/cm$^3$, $1 \times 10^{16}$ atoms/cm$^3$, and $1 \times 10^{15}$ atoms/cm$^3$, respectively.

FIGS. 2 (a) to 2(c) are vertical cross-sectional diagrams illustrating an example of a production process of the method for producing the three-dimensional structure according to an embodiment of the present invention.

FIGS. 3 (a) and 3(b) are transmission electron microscopy (TEM) pictures illustrating vertical cross-sections of a pillar part when a pillar diameter is 70 nm and an oxide film thickness is 40 nm, produced using a high oxygen concentration silicon substrate and a low oxygen concentration silicon substrate, respectively, according to the production process illustrated in FIGS. 2(a) to 2(c).

FIGS. 4 (a) and 4(b) are transmission electron microscopy (TEM) pictures illustrating vertical cross-sections of a pillar part when a pillar diameter is 70 nm and a heat treatment temperature is 1000° C., produced using a high oxygen concentration silicon substrate and a low oxygen concentration silicon substrate, respectively, according to the production process illustrated in FIGS. 2(a) to 2(c).

FIGS. 5 (a) to 5(d) are transmission electron microscopy (TEM) pictures illustrating vertical cross-sections of a pillar before a heat treatment was performed using a high oxygen concentration silicon substrate, before a heat treatment was performed using a low oxygen concentration silicon substrate, after a heat treatment was performed using a high oxygen concentration silicon substrate, and after a heat treatment was performed using a low oxygen concentration silicon substrate, respectively, when a pillar diameter is 70 nm and an oxide film thickness is 40 nm, produced according to the production process illustrated in FIGS. 2(a) to 2(c).

FIGS. 6 (a) and 6(b) are transmission electron microscopy (TEM) pictures illustrating vertical cross-sections near an interface between an oxide film and a core at the bottom of a pillar after a heat treatment was performed using a high oxygen concentration silicon substrate and a low oxygen concentration silicon substrate, respectively, illustrated in FIGS. (5c) and 5(d).

FIGS. 7 (a) and 7(b) are transmission electron microscopy (TEM) pictures illustrating vertical cross-sections near an interface between an oxide film and a core at a distal end of a pillar after a heat treatment was performed using a high oxygen concentration silicon substrate and a low oxygen concentration silicon substrate, respectively, illustrated in FIGS. 5c) and 5(d).

DETAILED DESCRIPTION OF THE INVENTION

Hereinafter, embodiments of the present invention will be described with reference to examples.

A method for producing a three-dimensional structure according to an embodiment of the present invention produces a three-dimensional structure using a vertical transistor wafer according to an embodiment of the present invention, formed of a monocrystalline silicon substrate having a surface layer having an oxygen concentration of $1 \times 10^{17}$ atoms/cm$^3$ or more. That is, first, a surface of a silicon substrate is processed to form a three-dimensional shape. In this case, for example, a pattern is formed using photolithography and a three-dimensional shape is formed on the surface of the silicon substrate by removing an unnecessary portion by etching.

After the three-dimensional shape is formed, a heat treatment is performed to form an oxide film on the surface of the three-dimensional shape. In this way, it is possible to produce a three-dimensional structure having a core mainly consisting of Si and an oxide film formed on the surface thereof. In this case, the heat treatment is preferably performed in a dry oxygen atmosphere in order to accelerate oxidation, for example. Moreover, for example, the heat treatment temperature is preferably between 800° C. and 1000° C. and the treatment time is preferably adjusted according to a required thickness of the oxide film.

As the shape of the three-dimensional structure, when a direction along a thickness direction of the silicon substrate is a height H, a shortest portion in a direction vertical to the height H is a width W, and a direction vertical to the width W is a length L (≥W), it is possible to form a pillar structure in which H/W>1 and L/W=1, a fin structure in which H/W>1 and L/W>1, a wire structure in which H/W=1 and L/W>1, a dot structure in which H/W=1 and L/W=1, a ribbon structure in which H/W<1 and L/W≥1, and the like, for example. In this case, it is preferable that 1 nm≤H≤1000 nm, 1 nm≤L≤10000 nm, and 1 nm≤W≤100 nm. Particularly, it is preferable that 5 nm≤H, and H≤100 nm.

Figure 1A:
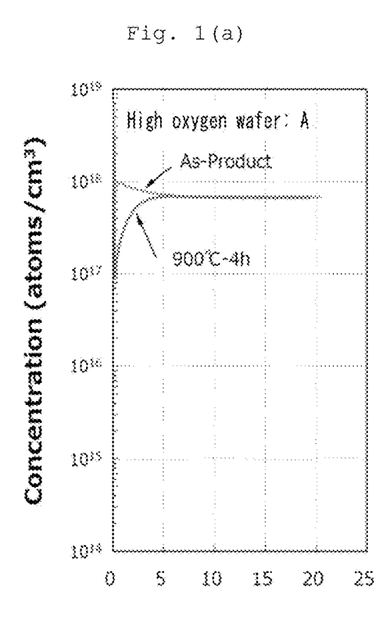
Figure 1B:
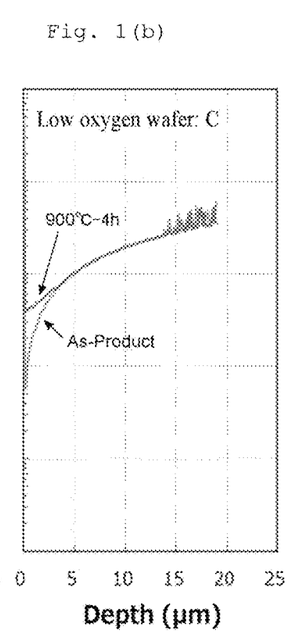
Figure 1C:
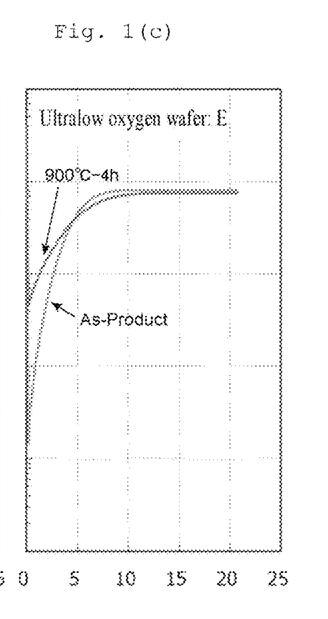

As illustrated in FIG. 1(a), it is understood that, when a heat treatment was performed for four hours at 900° C. in an oxygen atmosphere using a silicon substrate (product name "ELAS (registered trademark)-A"; product of GlobalWafers Japan Co., Ltd.) in which an oxygen concentration of a surface layer is approximately $1 \times 10^{18}$ atoms/cm$^3$, the oxygen concentration decreases in a region at a depth up to approximately 5 μm from the surface of the silicon substrate and oxygen diffuses outward. Due to this, it is understood that it is possible to supply oxygen atoms necessary for forming the oxide film from the silicon substrate as well as the heat treatment atmosphere simultaneously. In contrast, as illustrated in FIGS. 1(b) and 1(c), it is understood that, when a silicon substrate (product name "ELAS-C"; product of GlobalWafers Japan Co., Ltd.) in which an oxygen concentration of a surface layer is approximately $1 \times 10^{16}$ atoms/cm$^3$ and a silicon substrate (product name "ELAS-E"; product of GlobalWafers Japan Co., Ltd.) in which an oxygen concentration of a surface layer is approximately $1 \times 10^{15}$ atoms/cm$^3$ are used, the oxygen concentration near a surface layer increases by the heat treatment and oxygen is taken in mainly from the heat treatment atmosphere.

In this manner, when a silicon substrate in which an oxygen concentration of a surface layer is approximately $1 \times 10^{18}$ atoms/cm$^3$ or preferably $1 \times 10^{17}$ atoms/cm$^3$ or more is used, since oxygen is supplied from the silicon substrate during the heat treatment, it is possible to realize uniform oxide film growth. Moreover, since the oxygen supplied from the silicon substrate is directly combined with Si emitted from the surface of the three-dimensional shape to form an Si—O bond, it is possible to allow Si to contribute to forming the oxide film without being sublimated from the oxide film and to suppress the emission of Si due to the heat treatment. Moreover, in this way, it is possible to prevent the core portion mainly consisting of Si from becoming narrow. Moreover, since a uniform oxide film is formed, it is possible to make an interface between the oxide film and the core smooth as compared to when a silicon substrate having a low oxygen concentration is used.

In this way, due to the method for producing the three-dimensional structure according to the embodiment of the present invention, it is possible to produce a three-dimensional structure having an oxide film. In the produced three-dimensional structure, since the interface between the core and the oxide film is smooth, movement of electrons in the core is smooth, an electrical resistance decreases, power consumption is suppressed, and excellent electrical characteristics are obtained. Moreover, since introduction sources of crystalline defects such as dislocation and stacking defects decrease, structural defects such as deformation and rupture are suppressed.

A substrate having the produced three-dimensional structure can be used as a vertical transistor substrate according to an embodiment of the present invention. Moreover, the method for producing a vertical transistor according to an embodiment of the present invention can produce a vertical transistor having excellent electrical characteristics using the produced three-dimensional structure. The method for producing the vertical transistor using the three-dimensional structure may be an arbitrary method such as an existing method as long as the method can produce a vertical transistor.

Example 1

Using silicon substrates in which the oxygen concentrations of the surface layers are different, three-dimensional structures having a columnar pillar structure were produced according to the method for producing the three-dimensional structure according to the embodiment of the present invention. As the silicon substrates, at least two types of silicon substrates including a high oxygen concentration silicon substrate (product name "ELAS-A"; product of GlobalWafers Japan Co., Ltd.; hereinafter referred to as "high oxygen A1") in which an oxygen concentration of a surface layer up to a depth of 200 nm from the surface is 1×10^18 atoms/cm³ or more and a low oxygen concentration silicon substrate (product name "ELAS-C"; product of GlobalWafers Japan Co., Ltd.; hereinafter referred to as "low oxygen C") in which an oxygen concentration of a surface layer up to a depth of 200 nm from the surface is approximately 1×10^16 to 5×10^16 atoms/cm³ were used.

Figure 2A:
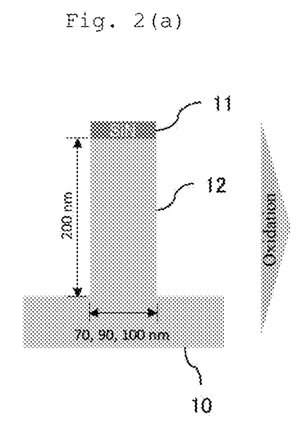
Figure 2B:
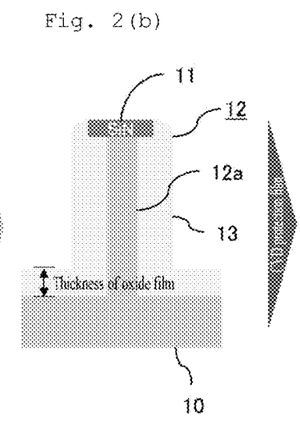
Figure 2C:
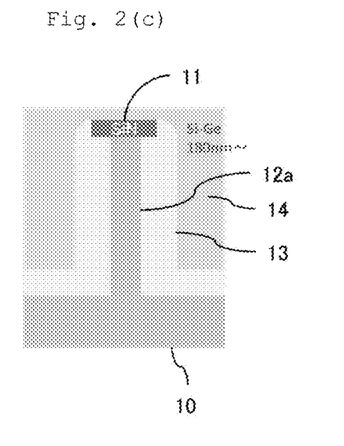

First, as illustrated in FIG. 2(a), immersion lithography was performed using an SiN film 11 as a mask to form a columnar pillar 12 on the surface layer of a silicon substrate 10. In this case, the height of the pillar 12 was set to 200 nm and three types of diameters of 70 nm, 90 nm, and 100 nm were used. Subsequently, as illustrated in FIG. 2(b), a heat treatment was performed inside an oxidation furnace of a dry oxygen atmosphere to form an oxide film 13 made from $SiO_2$ on the surface. In this way, the inner side of the oxide film 13 in the portion of the pillar 12 became a core 12a mainly consisting of Si. Furthermore, as illustrated in FIG. 2(c), an SiGe film 14 having a thickness of 180 nm or more was formed on the surface of the oxide film 13 as a protection film according to a plasma CVD method.

Figure 3A:
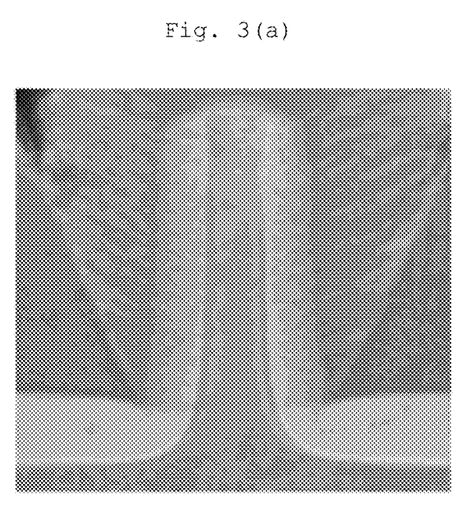
Figure 3B:
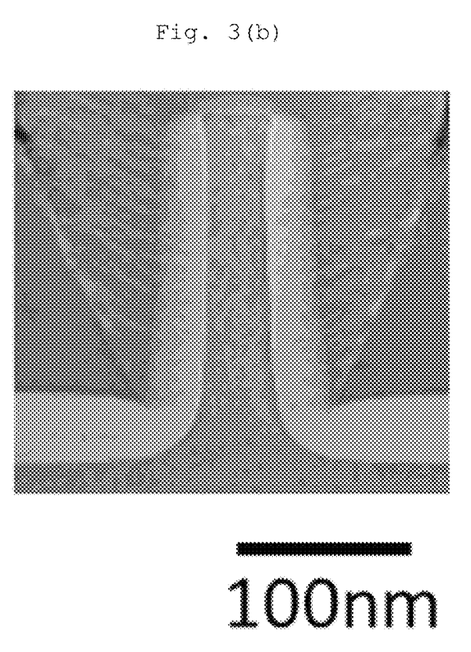

In order to examine the influence of the thickness of the oxide film 13, three-dimensional structures were produced in a state in which the heat treatment temperature in FIG. 2(b) was set to 900° C. and the thickness of the oxide film 13 was set to three types of 20 nm, 30 nm, and 40 nm. An example of observation results of a vertical cross-section in the portion of the pillar 12 corresponding to this case are illustrated in FIG. 3. During the cross-section observation, thin film samples of the cross-section were produced using FIB (focused ion beam) and were observed by TEM (transmission electron microscope).

The diameters of the outer edge of the oxide film 13 ($SiO_2$) and the core 12a (Si) in a halfway portion of the pillar 12 were calculated from TEM pictures of the vertical cross-sections, and the number of Si atoms in the oxide film 13 and the core 12a were calculated by computation assuming that a horizontal cross-section is a circle. Moreover, similarly in the portion of the pillar 12 before the heat treatment, the number of Si atoms in the halfway portion of the pillar 12 were calculated by computation. From the numbers of Si atoms before and after the heat treatment calculated in this manner, an emission percentage (%) of Si atoms due to the heat treatment were calculated by Equation (1) below.

Emission percentage of Si atoms=[1−(number of Si atoms in core 12a after heat treatment)+(number of Si atoms in oxide film 13 after heat treatment)/(number of Si atoms before heat treatment)]×100     (1)

Emission percentages of Si atoms due to the heat treatment with respect to each diameter of the pillar 12 and each thickness of the oxide film 13 in the respective silicon substrates 10 are illustrated in Table 1. As illustrated in Table 1, it was ascertained that if the thickness of the oxide film 13 and the diameter of the pillar 12 both are the same, the emission percentage of Si tends to decrease in a high oxygen concentration silicon substrate as compared to a low oxygen concentration silicon substrate. Moreover, it was also ascertained that the larger the thickness of the oxide film 13 and the smaller the diameter of the pillar 12, the higher the emission percentage of Si becomes.

TABLE 1

| | | | Diameter of pillar | | |
|---|---|---|---|---|---|
| | | | 70 nm | 90 nm | 100 nm |
| Thickness of oxide film | 20 nm | High oxygen A1 | 10% | 10% | 10% |
| | | Low oxygen C | 10% | 12% | 10% |
| | 30 nm | High oxygen A1 | 17% | 15% | 3% |
| | | Low oxygen C | 17% | 17% | 7% |
| | 40 nm | High oxygen A1 | 22% | 16% | 2% |
| | | Low oxygen C | 25% | 15% | 8% |

Figure 4A:
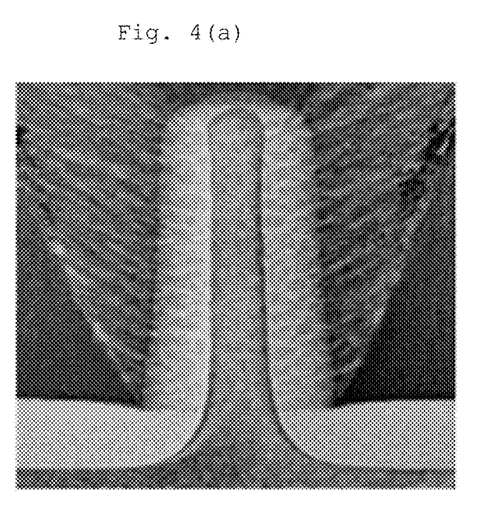
Figure 4B:
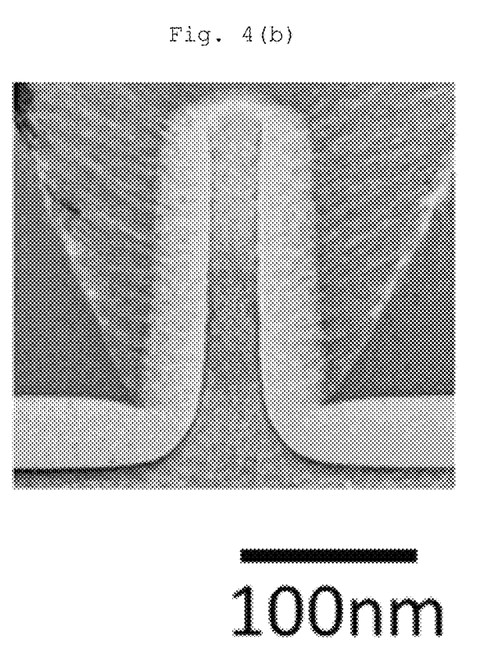

Subsequently, in order to examine the influence of the heat treatment temperature, three-dimensional structures were produced in a state in which the heat treatment temperature in FIG. 2(b) was set to three types of 800° C., 900° C., and 1000° C. and the thickness of the oxide film 13 was set to 40 nm. An example of observation results of a vertical cross-section in the portion of the pillar 12 corresponding to this case are illustrated in FIG. 4. During the cross-section observation, similarly to the case of FIG. 3, thin film samples of the cross-section were produced using FIB (focused ion beam) and were observed by TEM.

Moreover, the emission percentage (%) of Si atoms due to the heat treatment was calculated using Equation (1) similarly to the case of Table 1. Emission percentages of Si atoms due to the heat treatment with respect to each diameter of the pillar 12 and each temperature of the heat treatment in the respective silicon substrates 10 are illustrated in Table 2. As illustrated in Table 2, it was ascertained that if the temperature of the heat treatment and the diameter of the pillar 12 both are the same, the emission percentage of Si tends to decrease in a high oxygen concentration silicon substrate as compared to a low oxygen concentration silicon substrate. Moreover, it was also ascertained that the smaller the diameter of the pillar 12, the higher the emission percentage of Si becomes.

TABLE 2

| | | | Diameter of pillar | | |
|---|---|---|---|---|---|
| | | | 70 nm | 90 nm | 100 nm |
| Temperature of heat treatment | 800° C. | High oxygen A1 | 23% | 20% | 6% |
| | | Low oxygen C | 26% | 20% | 16% |
| | 900° C. | High oxygen A1 | 22% | 15% | 3% |
| | | Low oxygen C | 25% | 15% | 8% |
| | 1.000° C. | High oxygen A1 | 25% | 18% | 2% |
| | | Low oxygen C | 32% | 22% | 5% |

Subsequently, high-resolution TEM pictures of the portion of the pillar 12 were observed. In the observation, an atomic-resolution analytical electron microscope "JEM-ARM200F" (product of JEOL Ltd.) was used. Measure was conducted under conditions that an electron gun was a cold-cathode field-emission electron gun, an acceleration voltage was 200 kV, and a resolution was 100 pm. As observation samples, three-dimensional structures which were produced using a high oxygen concentration silicon substrate and a low oxygen concentration silicon substrate, respectively, and in which the diameter of the pillar 12 was 70 nm, and the thickness of the oxide film 13 was 40 nm as illustrated in FIGS. 3(a) and 3(b). Moreover, during observation of the cross-section, FIB processing was performed using a multibeam processing and observation system "JIB-4601F (product of JEOL Ltd.) to produce thin film samples.

Figure 5A:
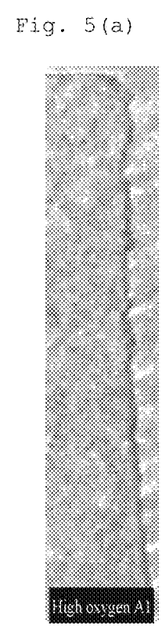
Figure 5B:
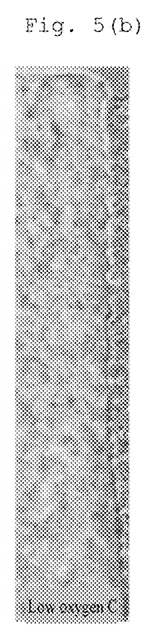
Figure 5C:
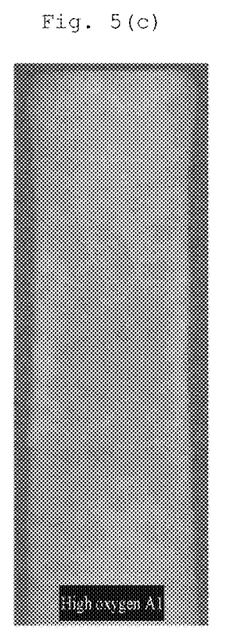
Figure 5D:
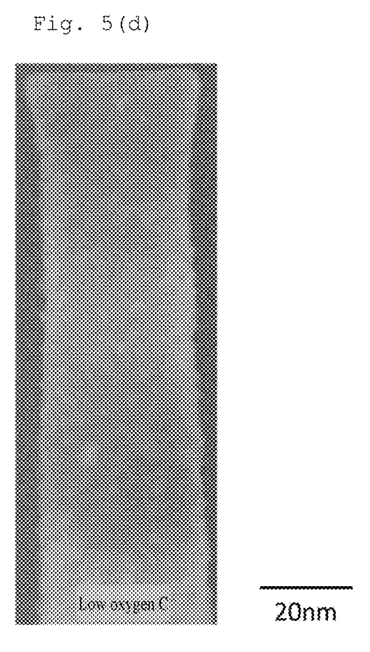
Figure 6A:
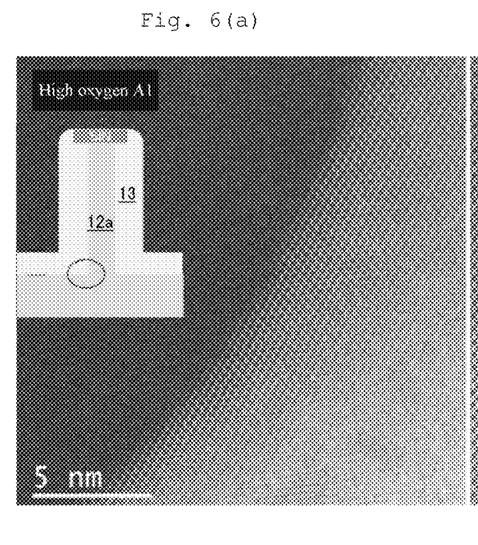
Figure 6B:
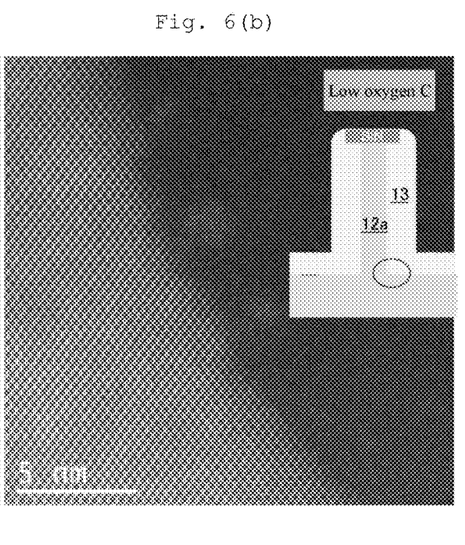
Figure 7A:
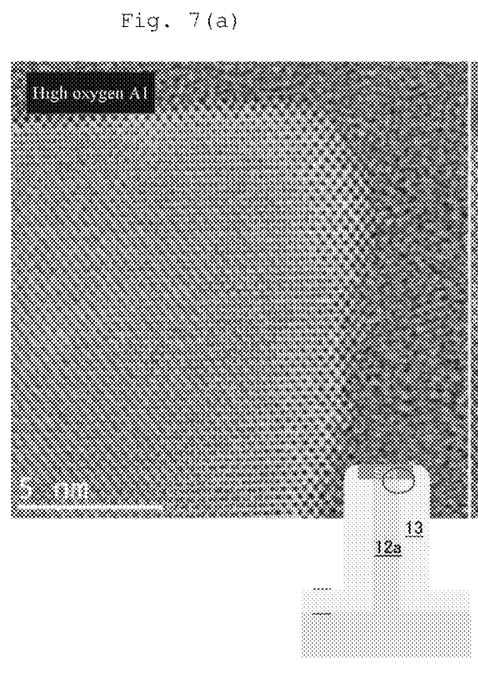
Figure 7B:
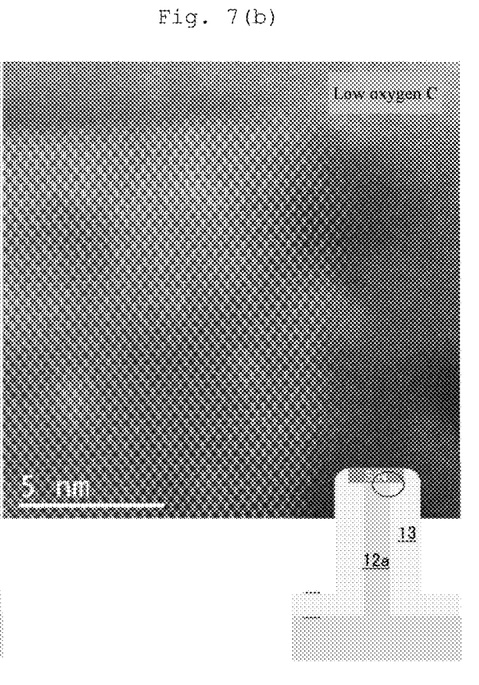

A vertical cross-section of the pillar 12 of each sample before and after the heat treatment, a vertical cross-section near the interface between the oxide film 13 and the core 12a at the bottom of the pillar 12 after the heat treatment, and a vertical cross-section near the interface between the oxide film 13 and the core 12a at the distal end of the pillar 12 after the heat treatment are illustrated in FIGS. 5, 6, and 7, respectively.

As illustrated in FIGS. 5(a) and 5(b), it was ascertained that in both three-dimensional structures using a high oxygen concentration silicon substrate and a low oxygen concentration silicon substrate, projections and recesses having a height difference of larger than 1.5 nm and a period of several tens of nm were observed on a side surface of the pillar 12 before the heat treatment and were not smooth. As illustrated in FIG. 5(c), it was ascertained that by performing the heat treatment, in the three-dimensional structures using a high oxygen concentration silicon substrate, projections and recesses having a height difference of 1.5 nm or smaller and a period of 10 nm or smaller were observed on the interface between the oxide film 13 and the core 12a of the pillar 12 and were smooth. In contrast, as illustrated in FIG. 5(d), it was ascertained that in a three-dimensional structure using the low oxygen concentration silicon substrate 10, even when the heat treatment was performed, a number of projections and recesses having a height difference of larger than 1.5 nm and a period of 10 nm or smaller remained on the interface between the oxide film 13 and the core 12a of the pillar 12 and were not smooth.

Moreover, as illustrated in FIGS. 6(a) and 7(a), it was ascertained that in the three-dimensional structure using a high oxygen concentration silicon substrate, Si atoms (white dots in each drawing) were observed clearly, and the interface between the oxide film 13 and the core 12a of the pillar 12 was observed clearly and was smooth. In contrast, as illustrated in FIGS. 6(b) and 7(b), it was ascertained that in the three-dimensional structure using a low oxygen concentration silicon substrate, Si atoms (white dots in each diagram) near the interface between the oxide film 13 and the core 12a of the pillar 12 were unclear and blurred, and the interface between the oxide film 13 and the core 12a of the pillar 12 was not clear. This is because O2 enters into the vicinity of the interface, and as a result, the interface is not smooth.

REFERENCE SIGNS LIST

10: Silicon substrate
11: SiN film
12: Pillar
12a: Core
13: Oxide film
14: SiGe film

What is claimed is:

1. A method for producing a three-dimensional structure, comprising:
   processing a surface layer of a silicon substrate to form a three-dimensional shape, the surface layer having an oxygen concentration of $1 \times 10^{18}$ atoms/cm$^3$ or ore; and
   performing a heat treatment to form an oxide film on a surface of the three-dimensional shape to produce the three-dimensional structure, the three-dimensional structure having an oxygen concentration of $1 \times 10^{17}$ atoms/cm$^3$ or more and projections and recesses in a thickness direction of the silicon substrate, a height of the three-dimensional structure in the thickness direction being between 1 nm and 100 nm, wherein
   the heat treatment temperature is in a range of 800° C. to 900° C.

2. The method for producing the three-dimensional structure according to claim 1, wherein the three-dimensional structure has a length of between 1 nm and 10000 nm in a first direction perpendicular to the thickness direction and has a width of between 1 nm and 100 nm in a second direction perpendicular to the thickness direction.

3. The method for producing the three-dimensional structure according to claim 1, wherein the three-dimensional shape is formed by processing the surface layer by etching.

4. The method for producing the three-dimensional structure according to claim 1, wherein the silicon substrate is a monocrystalline silicon substrate.

5. A method for producing a vertical transistor, comprising:
   producing the three-dimensional structure according to the method of claim 1; and
   producing transistors using the three-dimensional structure.

* * * * *